US006307225B1

(12) United States Patent
Kijima et al.

(10) Patent No.: US 6,307,225 B1
(45) Date of Patent: Oct. 23, 2001

(54) INSULATING MATERIAL, SUBSTRATE COVERED WITH AN INSULATING FILM, METHOD OF PRODUCING THE SAME, AND THIN-FILM DEVICE

(75) Inventors: Takeshi Kijima, Omiya; Hironori Matsunaga, Fujisawa, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/596,574

(22) Filed: Jun. 16, 2000

Related U.S. Application Data

(63) Continuation-in-part of application No. PCT/JP98/05761, filed on Dec. 18, 1998.

(30) Foreign Application Priority Data

Dec. 19, 1997 (JP) ..................................... 9-365431

(51) Int. Cl.[7] .......................... H01L 21/76; H01L 27/108
(52) U.S. Cl. ................ 257/295; 148/33.3; 148/DIG. 81; 148/DIG. 118
(58) Field of Search ...................... 438/446, 3, FOR 220, 438/FOR 193, FOR 396; 257/295; 148/33.3, DIG. 81, DIG. 118

(56) References Cited

U.S. PATENT DOCUMENTS 6,010,744 * 1/2000 Buskirk et al. .

6,120,846 * 9/2000 Hintermaier et al. .

FOREIGN PATENT DOCUMENTS

| 5243525-A | * | 9/1993 | (JP) . |
| A812494 | | 1/1996 | (JP) . |
| A-10200059 | | 7/1998 | (JP) . |
| 323591-A | * | 11/2000 | (JP) . |

OTHER PUBLICATIONS

Epitaxial Growth of Bismuth Silicate by CVD, IBM Technical Disclosure Bulletin, Jan. 1991, US, vol. 33, Issue 8, p. 355.*

T. Kijima et al., The Japan Society of Applied Physics, Part 1, vol.37, No. 9B, pp. 5171–5173 (1998).

* cited by examiner

Primary Examiner—George Fourson
Assistant Examiner—Thanh Pham

(57) ABSTRACT

A bismuth silicate film (insulating film) 3 of $Bi_2SiO_5$ oriented predominantly in the direction of (100) is formed on a Si substrate 2 and a ferroelectric thin film 4 is formed on the bismuth silicate film 3 to create an MFIS structure having a c-axis-oriented ferroelectric thin film 4 formed with good reproducibility. A highly reliable thin film device is produced by applying the MFIS structure to a FET.

10 Claims, 12 Drawing Sheets

FORMING PRESSURE: 2 Torr

FORMING PRESSURE: 10 Torr

FORMING PRESSURE: 10 Torr (WITHOUT SUPPLYING Ti MATERIAL)

FORMING TIME: 30 Minute

FORMING TIME: 60 Minute

SUBSTRATE TEMPERATURE: 500 °C

SUBSTRATE TEMPERATURE: 600 °C

INSULATING MATERIAL, SUBSTRATE COVERED WITH AN INSULATING FILM, METHOD OF PRODUCING THE SAME, AND THIN-FILM DEVICE

This application is a Continuation-In-Part of PCT International Application No. PCT/JP98/05761 filed on Dec. 18, 1998, which designated the United States and on which priority is claimed under 35 U.S.C. § 120, the entire contents of which are hereby incorporated by reference.

CROSS-REFERENCES TO RELATED APPLICATION

This application is related to Japanese application No. Hei 9(1997)-365431 filed on Dec. 19, 1997 whose priority is claimed under 35 USC §119, and International application No. PCT/JP98/05761 filed on Dec. 18, 1998, the disclosures of which are incorporated by reference in their entirety.

FIELD OF THE INVENTION

The present invention relates to an insulating material, a substrate covered with an insulating film, a fabrication process and use thereof. The insulating material and the substrate covered with the insulating film of the present invention can be suitably used for application to memory devices, pyroclectric devices, piezoelectric devices and the like.

BACKGROUND ART

There have been demanded ferroelectric non-volatile memories in which operation speed and the number of data rewriting are improved by utilizing spontaneous polarization characteristics of ferroelectric materials as compared with conventional non-volatile memories such as EEPROM and flash memory. Memory cell structures fundamental to the non-volatile memories are classified into the following two types.

A first type is a type wherein a conventional memory capacitor of DRAM is replaced with a ferroelectric capacitor. The first type includes a structure wherein a ferroelectric capacitor of a ferroelectric thin film sandwiched with electrodes is connected to a source or a drain of a MOS transistor through a polysilicon plug or the like. This is called a one transistor-one capacitor type memory cell. Currently, ferroelectric non-volatile memories utilizing the memory cell of the first type have been practically used.

However, to deal with an increase of memory capacity and higher integration for the future, realization of a structure in which one transistor solely constitutes a memory cell (hereinafter this structure is referred to as a second type) has been demanded. However, since there are problems in that ferroelectric materials having necessary characteristics for the realization have not been obtained and fabrication techniques thereof have not been established, memory cells of the second type have not been materialized yet. Hereinafter, the problems are explained in detail.

The memory cell of the second type utilizes, as its fundamental structure, a gate element of MFS (ferroelectric material—metal—semiconductor) structure wherein a ferroelectric thin film and a gate electrode are layered on a surface of a semiconductor substrate. Most of the ferroelectric thin films currently applicable are oxides and require a thermal treatment at a high temperature in an oxidizing atmosphere to crystallize the oxides at the formation of the thin films. Therefore, at the formation of the ferroelectric thin film, an oxide layer (e.g., $SiO_2$ layer) having low dielectric constant tends to be formed at its interface to the semiconductor substrate (e.g., Si). Further, it is problematic in that reaction and mutual diffusion between elements constituting the ferroelectric thin film and the semiconductor substrate cannot be avoided.

Accordingly, it is also difficult to obtain normal characteristics of the MFS because it is extremely difficult to realize a favorable interface state. That is, moving carriers are generated owing to impurities and defects introduced to the inside of the semiconductor substrate or the interface, which leads to a flat band shift in C-V hysteresis characteristics of the MFS and an increase in leak current. As a result, the C-V hysteresis characteristics which reflect the characteristics of the ferroelectric material are lost in a short period so that the memory cannot be maintained. Thus, even if an FET is actually fabricated in the conventional MFS structure, a memory maintaining time is only a few minutes to a few hours. In contrast, the memory cell of the first type realizes a memory maintaining time for more than 10 years. The most important subject of the memory cell of the second type for practical use thereof is an improvement of the memory maintaining time.

Ferroelectric materials used for the memory cell of the second type are desirably materials which are capable of reversing polarization at a low voltage (low coercive electric field Ec) and do not deteriorate (are not exhausted) in the ferroelectric characteristics through repetition of polarization reversal. Further, for forming directly on the Si substrate, a ferroelectric material capable of forming at a temperature as low as possible and a fabrication process thereof are required to inhibit the reaction and mutual diffusion between the elements.

As the ferroelectric materials used for the memory cell of the second type, ferroelectric materials made of Bi-containing oxide of layered structure are excellent in resistance to exhaustion and expected as an alternative to conventional Pb-containing ferroelectric materials represented PZT. Among them, a ferroelectric material $Bi_4Ti_3O_{12}$ having great anisotropy exhibits good bulk characteristics of spontaneous polarization Ps=50 $\mu C/cm^2$ and Ec=50 kv/cm in the direction of a-axis, and Ps=4 $\mu C/cm^2$ and Ec=5 kv/cm in the direction of c-axis.

The ferroelectric material exhibiting smaller coercive electric field in the c-axis direction is useful for the memory cell of the second type, and therefore it has been proposed in the past to apply the material to the MFS structure (for example, see IEEE Trans. Electron Devices, ED-21 (1974) 499–504; J. Appl. Phys. 46 (1975) 2877–2881). These documents describe a process for obtaining a crystalline thin film by sputtering at a high temperature such as 675° C. or more and a process for obtaining a crystalline thin film by annealing at 650° C. after formation by sputtering at a low temperature.

However, in the above processes, since the thin film is formed al a high temperature, a layer having low dielectric constant made of silicon oxide is generated at the interface between the Si substrate and the ferroelectric thin film. When a voltage is applied to the resulting memory cell of the MFS structure, a major part of the applied voltage is distributed to the low dielectric layer. Accordingly, it is difficult to apply enough voltage to the ferroelectric thin film having higher dielectric constant for the reversal of the polarization. Further, the ferroelectric thin film is not sufficient in an orientation along the c-axis direction and the thickness thereof is as great as 1 $\mu m$ or more. Therefore it requires a high voltage to be applied to reverse the polarization of the ferroelectric thin film. Moreover, it is difficult to perform a stable memory operation because of an electric charge injection phenomenon caused by defects generated by the reaction at the interface between the Si substrate and the ferroelectric thin film.

Then, in order to realize a more favorable connection at the interface between the ferroelectric thin film and the semiconductor substrate, there has been studied a MFIS (metal ferroelectric material—insulator—semiconductor) structure in which the ferroelectric thin film is formed on an insulating film formed preliminary by epitaxially growing an insulating material having relatively high dielectric constant into a thin film on a surface of the Si substrate. As the insulating film, an epitaxial film such as $ZrO_2$ or $CeO_2$ is used. The insulating film is generally formed by a vapor deposition technique and requires a thermal treatment at a temperature as high as 800° C. or more. Therefore, in a memory cell of the MFIS structure utilizing $CeO_2$ as the insulating film and $PbTiO_3$ as the ferroelectric thin film (for example, see Jpn. J. Appl. Phys. 34 (1995), 4163–4166), an $SiO_2$ layer is generated between the Si substrate and the insulating film. Further, the C-V hysteresis characteristics are deteriorated over about 11 hours. Moreover, since the insulating film and the ferroelectric film are made of completely different materials, they need to be formed individually with different forming devices, which makes the process complicated.

To solve the above problems, the inventors of the present invention have reported a process for forming a bismuth silicate film as the insulating film on the surface of the Si substrate and forming thereon a ferroelectric thin film made of $Bi_4Ti_3O_2$ oriented along the c-axis direction (see Japanese Unexamined Patent Publication No. HEI 8(1996)-12494).

In the above process, a $SiO_2$ layer is removed first from the surface of the Si substrate. Then, a thin film of bismuth silicate ($Bi_2SiO_5$, $Bi_{12}SiO_{20}$ and the like) is formed by a metal-organic chemical vapor deposition (MOCVD) technique. That is, the bismuth silicate film is formed by supplying a Bi material gas and an $O_2$ gas simultaneously to the surface of the Si substrate and reacting Si on the surface of the Si substrate with Bi and O in the material gases. Then, a thin film of $Bi_4Ti_3O_{12}$ is formed on the bismuth silicate film by adding a Ti material gas.

In this process, elements for constituting the insulating film are all contained in elements constituting the Si substrate and the ferroelectric thin film. Therefore it is advantageous in that mixing of impurity elements is avoided and the insulating film and the ferroelectric thin film can be successively formed in the same forming device.

Incidentally, processes described in Jpn. J. Appl. Phys. 32 (1993), 135–138 and Japanese Unexamined Patent Publication No. HEI 5(1993)-243525 are known as processes for forming the thin film of $Bi_4Si_3O_{12}$, for example. That is, the $SiO_2$ layer is preliminarily formed on the surface of the Si substrate. On the $SiO_2$ layer the $Bi_4Si_3O_{12}$ thin film is formed by supplying the Bi material gas and the $O_2$ gas simultaneously to the surface of the $SiO_2$ layer by the MOCVD technique.

A surface morphology of the ferroelectric film formed by the above process is made of crystalline particles having a plate form. Therefore unevenness and pinholes are present on the surface. Accordingly, the thickness of the film may be locally insufficient because of the unevenness on the surface, and favorable ferroelectric characteristics are hardly obtained with the thickness as small as 200 nm or less because of the pinholes. Further, in terms of reduction of a driving voltage of a semiconductor device, the thickness of the ferroelectric thin film is required to be reduced in the MFIS structure, for which the ferroelectric thin film needs to be formed more accurately.

Furthermore, it is necessary to add the Ti material gas while forming the $Bi_4Ti_3O_2$ thin film after the bismuth silicate film is formed. According to this, a modification of other forming conditions (flow rate of a carrier gas and the like) is required, which makes the formation process complicated.

Additionally, in order to obtain a memory cell of the MFIS structure with a longer memory maintaining time by inhibiting the mutual diffusion and the like between the semiconductor substrate and the bismuth silicate film and preventing deterioration of the state of the interface therebetween, it has been demanded to lower the temperature for forming the bismuth silicate film (550° C. or more in the case of $Bi_2SiO_5$, for example) to a further extent.

DISCLOSURE OF THE INVENTION

As a result of intensive examination, the inventors of the present invention have solved the above problems and found that a memory cell of the MFIS structure with a longer memory maintaining time can be obtained by realizing a favorable interface state between the Si substrate and the ferroelectric thin film, and thus reached the present invention.

According to the present invention, provided is an insulating material comprised of a crystalline material containing Ti in $Bi_2SiO_5$ in a Bi/Ti atomic concentration ratio of 3 or more.

Further, according to the present invention, provided is a substrate covered with an insulating film characterized in that the above insulating material is formed on a Si substrate as an insulating film.

Furthermore, according to the present invention, provided is a thin film device characterized by having electrodes on an upper surface of a ferroelectric thin film formed on the above-described substrate covered with the insulating film and on a lower surface of the Si substrate, and comprising a structure of upper electrode/ferroelectric thin film/insulating film/lower electrode.

Still further, according to the present invention, provided is a process for fabricating a substrate covered with an insulating film characterized in that the above insulating film is formed by heating and vaporizing a material comprised of a metal compound containing Bi and a metal compound containing Ti and supplying the vaporized gas together with an inert carrier gas and an oxygen gas simultaneously to a Si substrate heated and maintained at a predetermined temperature under a predetermined pressure.

MODE FOR CARRYING THE INVENTION

Figure 1:
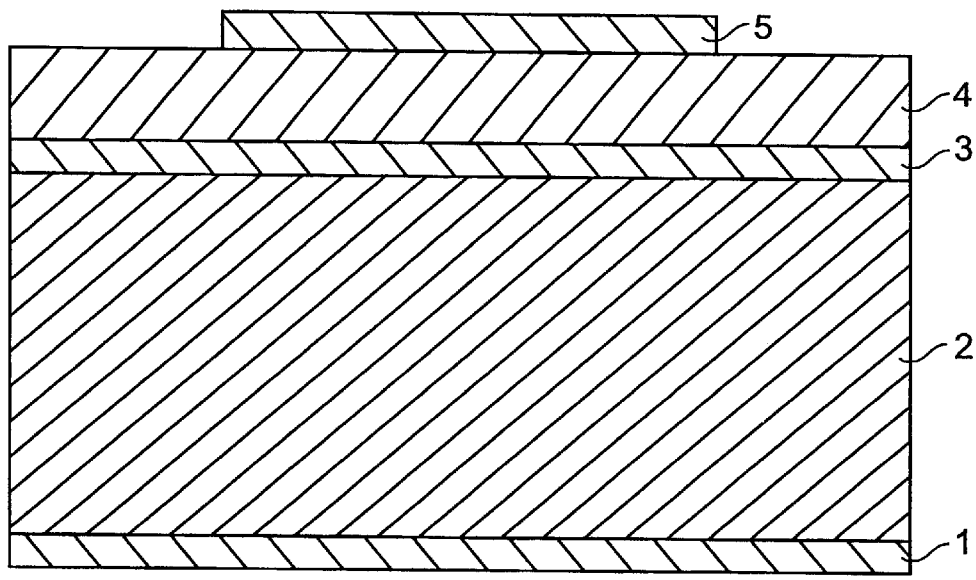
FIG. 1 is a schematic sectional view of a thin film device according to the present invention.

An insulating material of the present invention comprises a crystalline material containing Ti in $Bi_2SiO_5$ in a Bi/Ti atomic concentration ratio of 3 or more. The insulating material of the present invention, when formed on an optional substrate, can make its surface fine and smooth as compared with an insulating material in which Ti is not contained. It is considered that Ti becomes an extremely fine crystal nucleus of titanium oxide at the formation of $Bi_2SiO_5$ and the crystal nucleus contributes to the formation of fine $Bi_2SiO_5$. The Bi/Ti atomic concentration ratio of smaller than 3 is not preferable because a titanium oxide crystal phase is mixed. Particularly preferable Bi/Ti atomic concentration ratio is about 3 to 5 (for example, 3, 3.5, 4, 4.5 and 5).

Further, a substrate covered with an insulating film according to the present invention comprises an insulating film made of the above insulating material formed on a Si substrate. The thickness of the insulating film formed on the Si substrate varies according to the use of the substrate, but can be set to about 20 nm or less (preferably about 10 to 20 nm).

A surface for forming the insulating film of the Si substrate is preferably formed of a single crystal of plane (100). By using such a Si substrate, the orientation of the insulating film formed on the Si substrate can be predominantly controlled along the direction of (100).

The insulating film preferably has the predominant orientation along the direction of (100). By using thus oriented insulating film, orientation of a Bi-containing oxide of layered structure which will be mentioned later can be controlled along the direction of (001) (hereinafter referred to as a c-axis direction) with good reproducibility.

Next, a ferroelectric thin film made of a Bi-containing oxide of layered structure is preferably formed on the insulating film. The insulating film also serves as a buffer layer when the ferroelectric thin film is formed. Examples of the oxide of Bi-based layered structure include $Bi_4Ti_3O_{12}$, $SrBi_2Ta_2O_9$, $SrBi_2Nb_2O_9$, $SrBi_2(Ta, Nb)_2O_9$ and the like. Among them, $Bi_4Ti_3O_{12}$ is particularly preferable. Where the orientation of $Bi_4Ti_3O_{12}$ is controlled along the c-axis direction, it is more preferable because a coercive electric field of the ferroelectric thin film can be reduced. The reduction of the coercive electric field allows development of a MFIS structure memory cell of one transistor type and an infrared sensor array which are capable of being driven at a low voltage and maintain the memory for a long time.

The ferroelectric thin film is preferably thicker than the insulating film. If the thickness of the ferroelectric thin film is smaller than the insulating film, capacitance of the ferroelectric thin film region becomes too large. When a voltage is applied, this is not preferable because a voltage distributed to the ferroelectric thin film becomes small. More specifically, the thickness of the ferroelectric thin film can be set to about 50 to 300 nm, though it varies depending on the use thereof. As described above, since the insulating film can make its surface fine and smooth, the ferroelectric thin film formed thereon does not generate much unevenness even if it is formed thin. Further, a surface morphology of the ferroelectric thin film can be fine and smooth, reflecting the fine and smooth surface of the underlying insulating film. Accordingly, generation of leak current caused by the unevenness can be inhibited so that the thicknesses of the respective films constituting the MFIS structure can be smaller. As a result, where the MFIS structure is applied to a memory cell, the polarization of the ferroelectric thin film can be reversed at a lower voltage.

A preferable combination of the films constituting the substrate covered with the insulating film according to the present invention is a combination of $Bi_4Ti_3O_{12}$ thin film oriented along the c-axis/$Bi_2SiO_5$ film having the predominant orientation along the direction of (100)/Si substrate of single crystal of plane (100). According to the combination, the orientation of the $Bi_4Ti_3O_{12}$ thin film can be controlled along the c-axis direction. Thus, the $Bi_4Ti_3 O_{12}$ thin film oriented along the c-axis having a smaller coercive electric field can be effectively used.

Further, in the present invention, also provided is a thin film device having electrodes on an upper surface of a ferroelectric thin film which constitutes the substrate covered with the insulating film and on a lower surface of the Si substrate and comprising a structure of upper electrode/ferroelectric thin film/insulating film/Si substrate/lower electrode. A memory device, pyroelectric device, piezoelectric device and the like can be mentioned as the thin film device. It is preferable that a structure comprising upper electrode/ferroelectric thin film/insulating film in the structure of the thin film device functions as a gate element of a MOS-FET. Further, it is more preferable that the thin film device is a memory cell of a ferroelectric memory device.

Any conductive materials known in the art can be used as the electrodes. For example, Pt, Ir, $IrO_2$, $RuO_2$ and the like are mentioned.

Next, a process for fabricating a substrate covered with an insulating film of the present invention will be explained.

First, an insulating film is formed by heating and vaporizing a material comprised of a metal compound containing Bi and a metal compound containing Ti, and supplying the vaporized gas together with an inert gas and an oxygen gas simultaneously to a Si substrate heated and maintained at a predetermined temperature under a predetermined pressure. Incidentally, the above fabrication process of the insulating film is generally called as a MOCVD technique.

Examples of the metal compound containing Bi include organic metal compounds such as $Bi(C_6H_5)_3$ and $Bi(O—C_7H_7)_3$ and the like.

Examples of the metal compound containing Ti include organic metal compounds such as $Ti(i-OC_3H_7)_4$, $Ti(DPM)_2Cl_2$, $Ti(DPM)_2(i-OC_3H_7)_2$, $Ti(DPM)_2(OCH_3)_2$ and the like (DPM:bis(diphenylphosphino)methane).

The above materials are vaporized by heating and then introduced together with an inert carrier gas such as argon or $N_2$ and an oxidizing gas (such as an oxygen gas) into a chamber for forming the insulating film. Use amount of the oxidizing gas is preferably adjusted so that a desired insulating film can be obtained. Pressure in the chamber can be suitably adjusted according to the conditions such as the kinds of materials used, a temperature for heating the Si substrate and the like. Preferred pressure is about 5 to 10 Torr. The temperature for heating the Si substrate is preferably about 500 to 600° C. Further, a forming time is preferably about 10 to 30 minutes. As described above, by using the Si substrate of the single crystal of the plane (100), the orientation of the insulating film can be predominantly controlled along the direction of (100).

On the above-described insulating film, a ferroelectric thin film of an oxide of Bi-based layered structure can be formed. Similar to the formation of the above insulating film, the MOCVD technique can be used as a forming process of the ferroelectric thin film. Pressure in the chamber can be suitably adjusted depending on the conditions such as the kinds of materials used and a temperature for heating the Si substrate. Preferred pressure is about 2 to 5 Torr. The temperature for heating the Si substrate is preferably about 450 to 600° C. Further, a forming time is preferably about 10 minutes or more, more preferably about 20 to 60 minutes, most preferably about 20 to 30 minutes.

In particular, where the ferroelectric thin film is made of $Bi_4Ti_3O_{12}$, the insulating film and the ferroelectric thin film can be successively formed with the same forming device. Further, as a result of a detailed examination of the formation conditions of the insulating film and the ferroelectric thin film, the inventors of the present invention have found that where the ferroelectric thin film is made of $Bi_4Ti_3O_{12}$, it can be formed by changing only a forming pressure among the conditions for forming the insulating film. Since only the forming pressure is changed and other conditions (conditions for supplying materials and a substrate temperature) can be the same, the insulating film and the ferroelectric thin film can be formed very easily.

Further, since temperatures for crystallizing $Bi_2SiO_5$ and $Bi_4Ti_3O_{12}$ are about 500° C. or more and about 450° C. or more, respectively, the insulating film and the ferroelectric thin film can be formed at a temperature lower than conventional temperatures by about 50° C. or more. Since they can be formed at a temperature lower than a conventional one, mutual diffusion and reaction among elements each constituting the Si substrate, the insulating film and the ferroelectric thin film can be effectively inhibited so that a favorable interface can be obtained with good reproducibility. Thereby, the time during which the C-V hysteresis characteristics are maintained in the MFIS structure can be improved.

Moreover, by forming the ferroelectric thin film on the insulating film predominantly oriented along the direction of (100), the orientation of the resulting ferroelectric thin film can be controlled along the c-axis.

Incidentally, where the above-described substrate covered with the insulating film is applied to the thin film device, electrodes are formed on the lower surface of the Si substrate and on the upper surface of the ferroelectric thin film, respectively, but a fabrication process of these electrodes is not particularly limited and any known process can be used.

EXAMPLE 1

A thin film device was formed as shown in FIG. 1. That is, formed was a thin film device comprising a Si substrate 2, a bismuth silicate ($Bi_2SiO_5$) film 3 formed as an insulating film on the surface thereof and a $Bi_4Ti_3O_{12}$ thin film 4 formed thereon as a ferroelectric thin film. Further, a lower electrode 1 and an upper electrode 5 were formed on a lower surface of the Si substrate 2 and an upper surface of the ferroelectric thin film 4, respectively.

In this example, conditions for forming the bismuth silicate film 3 on the Si substrate 2 were examined in detail.

A vertical MOCVD device was used as a device for forming the bismuth silicate film 3. The device was constructed so that a material was supplied to the Si substrate placed horizontally on a substrate holder for heating in a chamber from a nozzle arranged at an upper portion of the chamber. Triorthotolylbismuth ($Bi(o-C_7H_7)_3$) was used as a Bi material and titanium tetraisopropoxide ($Ti(i-OC_3H_7)_4$) was used as a Ti material. Ar gas was used as a carrier gas and $O_2$ was used as an oxidizing gas.

The bismuth silicate film 3 was formed under the following forming conditions.

Substrate: P-type Si substrate of plane (100), specific resistance<0.2 Ωcm

Bi material: $Bi(o-C_7H_7)_3$

Heating temperature of 160° C.

Flow rate of carrier gas (Ar) of 300 sccm

Ti material: $Ti(i-OC_3H_7)_4$

Heating temperature of 50° C.

Flow rate of carrier gas (Ar) of 50 sccm

Oxidizing gas: $O_2$, flow rate of 1000 sccm

Balance gas: Ar, flow rate of 1250 sccm

Substrate temperature: five levels of 400, 450, 500, 550 and 600° C.

Forming pressure: three kinds of 2, 5 and 10 Torr

Forming time: 30 minutes

Figure 2A:
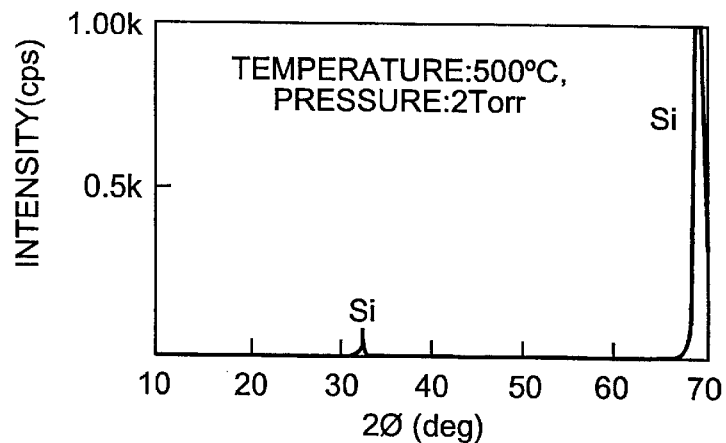
FIGS. 2(a)–2(c) are graphs illustrating X-ray diffraction patterns of bismuth silicate films according to Example 1 of the present invention.
Figure 2B:
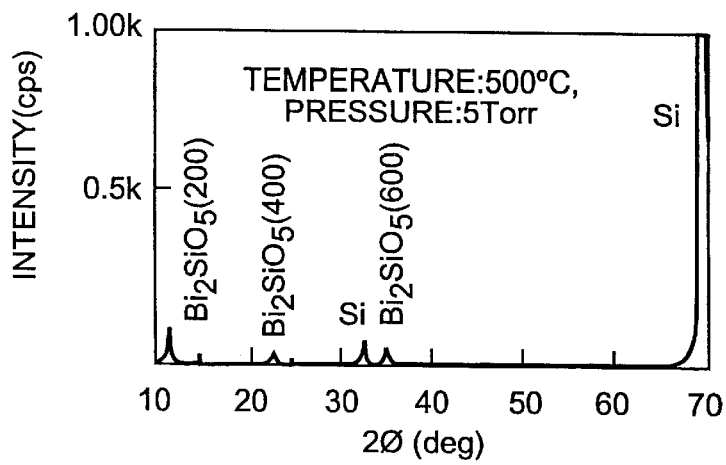
Figure 2C:
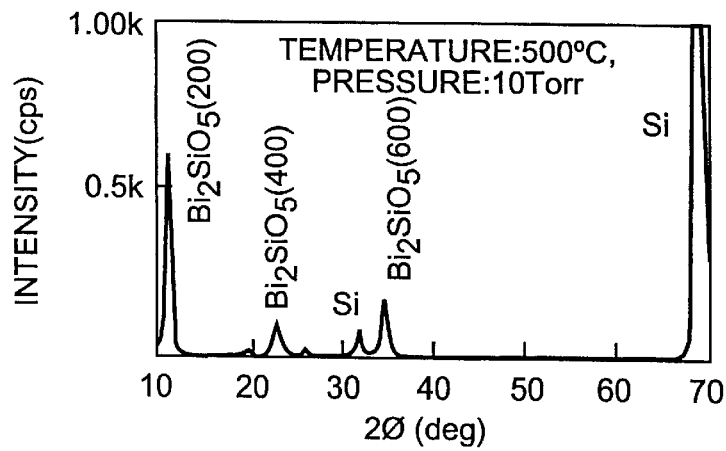
Figure 3A:
FIGS. 3(a) and 3(b) are pictures illustrating surface morphologies of the bismuth silicate films according to Example 1 of the present invention.
Figure 3B:
Figure 3C:
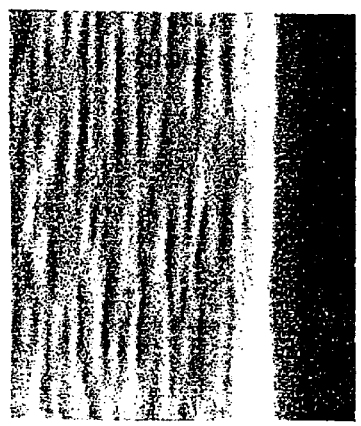
FIG. 3(c) is a picture illustrating a surface morphology of a bismuth silicate film for comparison.

The bismuth silicate film was formed according to the following procedure. First, an oxide film on the surface of the Si substrate was removed with a HF solution and washed with pure water. Then, the Si substrate was placed on the substrate holder in the chamber, and the chamber was quickly evacuated to vacuum to an order of $10^{-7}$ Torr. Then, the bismuth silicate film 3 was formed under the above forming conditions and gradually cooled to room temperature. Then the Si substrate was taken out. Crystallinity of the bismuth silicate film was evaluated by XRD (X-ray diffraction) and a surface morphology and thickness were evaluated with SEM (scanning electron microscope). Results are shown in Table 1. FIGS. 2(a) to 2(c) show XRD patterns of the bismuth silicate films formed at a substrate temperature of 500° C. under a forming pressure of 2, 5 and 10 Torr. Further, FIGS. 3(a) to 3(c) show the surface morphologies of the bismuth silicate films formed under the forming pressure of 2 and 10 Torr without supplying the Ti material.

TABLE 1

| | | substrate temperature (° C.) | | | | |
|---|---|---|---|---|---|---|
| | | 400 | 450 | 500 | 550 | 600 |
| pressure (Torr) | 2 | amorphous | amorphous | amorphous | weak BIT (pyro) | weak BIT (pyro) |
| | 5 | amorphous | amorphous | BSO (100) | BSO (100) | BIT + BSO (100) |

TABLE 1-continued

| | substrate temperature (° C.) | | | | |
|---|---|---|---|---|---|
| | 400 | 450 | 500 | 550 | 600 |
| 10 | amorphous | amorphous | BSO (100) | BSO (100) | BIT + BSO (random) |

BIT: bismuth titanate ($Bi_4Ti_3O_{12}$, layered perovskite phase)
BIT (pyro): bismuth titanate ($Bi_2Ti_2O_7$, pyrochlore phase)
BSO: $Bi_2SiO_5$ From Table 1 and FIG. 2, it is found that although the Ti material was supplied during the formation, bismuth silicate ($Bi_2SiO_5$) was formed from an amorphous state instead of bismuth titanate as the forming pressure increased at the substrate temperature ranging from 500 to 550° C. The orientation thereof was a single orientation along the direction of (100). Further, it is found that the reflection peak intensity also increased as the forming pressure became higher.

Further, from FIG. 3(*b*), it is found that the surface morphology of the bismuth silicate film having the single orientation was as fine and smooth as the amorphous.

Where the substrate temperature was raised to 600° C., bismuth titanate was grown. That is, it is found where the forming temperature was low, bismuth silicate was more liable to crystallize on the Si substrate surface than bismuth titanate and an orientation toward the direction of $Bi_2SiO_5$ (100) exhibiting an excellent lattice matching with respect to the plane (100) of the Si substrate was predominantly formed.

For comparison, FIG. 3(*c*) shows the surface morphology of the bismuth silicate film formed without supplying the Ti material. As can be understood from FIG. 3(*c*), the surface of the bismuth silicate film was rougher than the film formed with supplying the Ti material. This indicates that Ti inhibited the growth of crystalline particles of $Bi_2SiO_5$. That is, since Ti was much liable to be oxidized in this example, it is assumed that an extremely fine crystal nucleus of titanium oxide was generated with high density on the Si substrate surface in the beginning of the formation, and $Bi_2SiO_5$ crystal was grown using it as a nucleus thereof. Therefore, a finer film was obtained than in the case without the nucleus (i.e., the Ti material was not supplied).

By supplying the Ti material, Ti is contained in the bismuth silicate film. However, where the bismuth silicate film is applied to a memory cell of a MFIS structure which will be mentioned later, the bismuth silicate film is used as the insulating film so that it does not influence the electric characteristics of the MFIS structure memory cell.

Further, where the forming pressure was higher than about 10 Torr, vapor phase reaction of the material gases was liable to occur, so that particles of bismuth oxide were generated. Accordingly, it is found that the forming pressure of about 5 to 10 Torr at which the particles are not generated is preferable.

Lattice mismatching estimated from lattice constants of the crystalline materials is shown below.

plane (100) of $Bi_2SiO_5$/plane (100) of Si:-0.5%
plane (001) of $Bi_4Ti_3O_{12}$/plane (100) of $Bi_2SiO_5$:0.5%

Where the substrate temperature was 600° C., bismuth titanate began to generate and simultaneously the predominant orientation of $Bi_2SiO_5$ in the direction of (100) was lost as shown in Table 1.

Accordingly, it is found that the substrate temperature of about 500 to 600° C. and the forming pressure of about 5 to 10 Torr are particularly preferable to obtain a fine and smooth bismuth silicate film having a predominant orientation in the direction of (100) on the surface of the Si substrate.

EXAMPLE 2

A bismuth silicate film was formed in the same manner as Example 1 except that the substrate temperature was 500° C., the forming pressure was 10 Torr and the forming time was 5, 10, 20, 30 and 60 minutes.

Figure 4A:
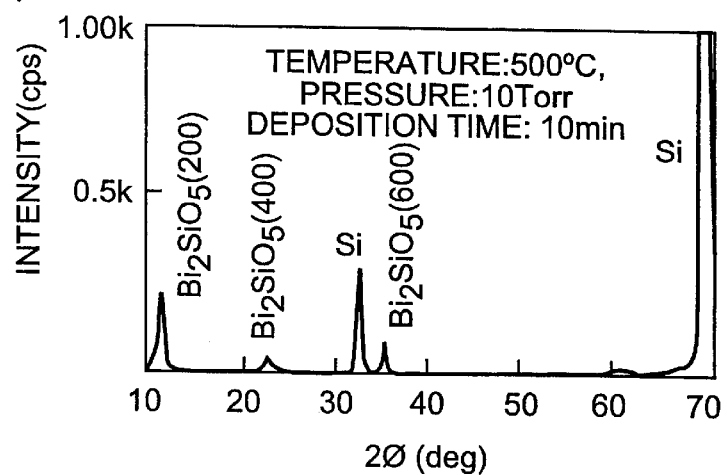
FIGS. 4(a)–4(c) are graphs illustrating X-ray diffraction patterns of bismuth silicate films according to Example 2 of the present invention.
Figure 4B:
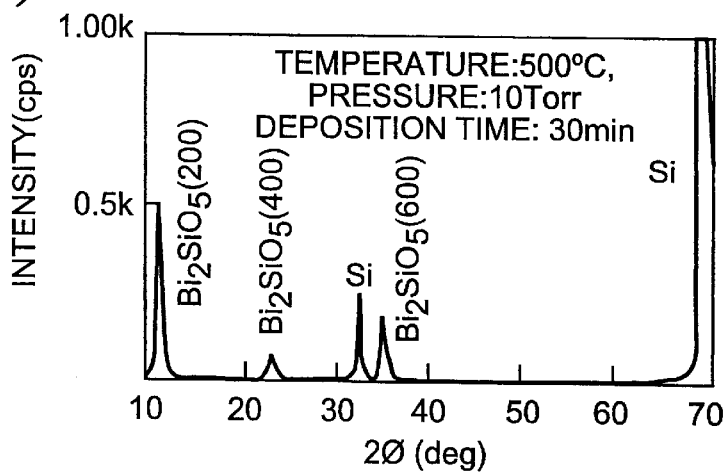
Figure 4C:
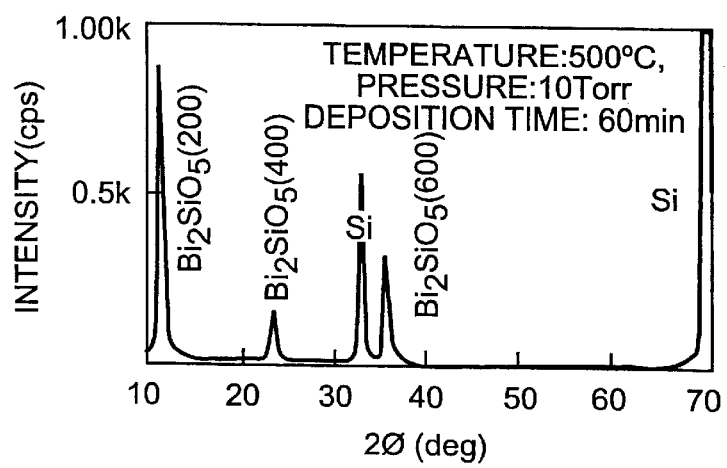
Figure 5A:
FIGS. 5(a)–5(b) are pictures illustrating surface morphologies of the bismuth silicate films according to Example 2 of the present invention.
Figure 5B:

FIGS. 4(*a*) to 4(*c*) indicate respective XRD patterns for the forming time of 10, 30 and 60 minutes. In FIGS. 4(*a*) to 4(*c*), it is found that all the bismuth silicate films had the predominant orientation in the direction of (100). FIGS. 5(*a*) and 5(*b*) show respective surface morphologies by SEM of the bismuth silicate films for the forming time of 30 and 60 minutes. The figures show that the surface morphology was roughed as the forming time became longer. According to this, it is found that the forming time is preferably set within 30 minutes to use the film as the insulating film. Incidentally, the thickness of the bismuth silicate film for the forming time of 30 minutes was about 20 nm as observed with the sectional SEM observation.

Figure 6:
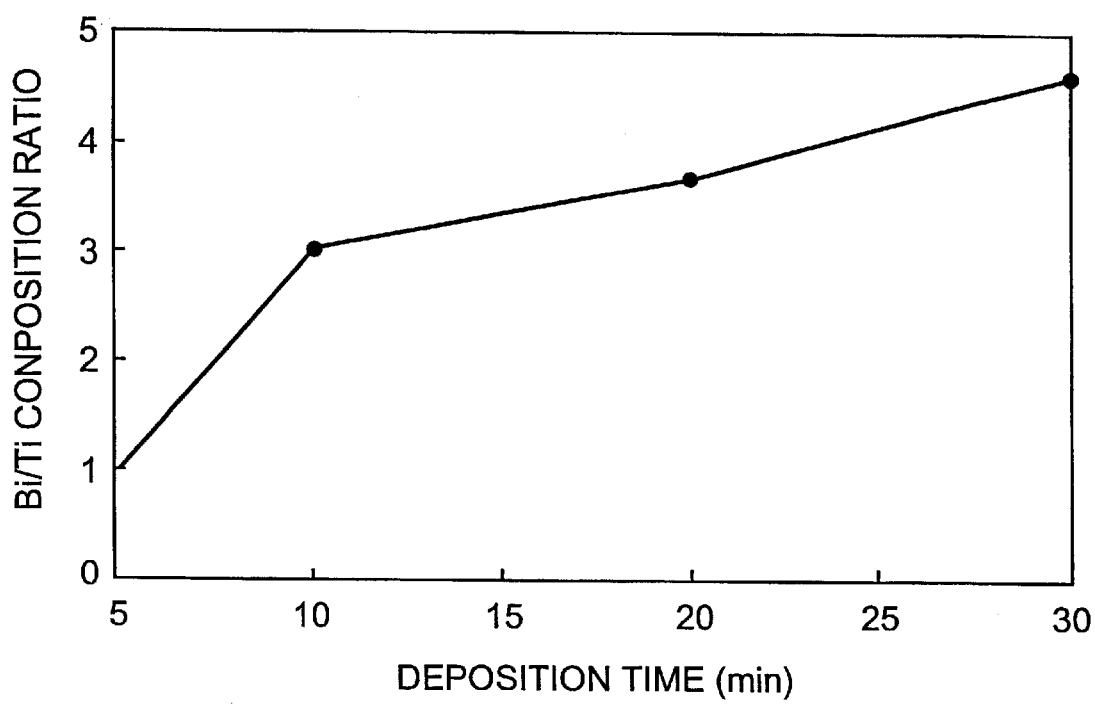
FIG. 6 is a graph illustrating an EPMA analysis result of the bismuth silicate film according to Example 2 of the present invention.

Further, results of EPMA analysis of Ti contents in the respective bismuth silicate films are shown in FIG. 6. In FIG. 6, the vertical axis indicates an atomic concentration ratio of Bi and Ti in the film and the horizontal axis indicates the forming time. It is observed that the concentration of Bi in the film was liable to increase as the forming time became longer. That is, it is indicated that Ti was much contained in the film in the beginning of the growth of the bismuth silicate film. This supports the assumption described above that an extremely fine crystal nucleus of titanium oxide was generated with high density on the Si substrate surface in the beginning of the formation and a fine crystal of $Bi_2SiO_5$ thin film was grown using it as a nucleus thereof. The XRD pattern indicates that $Bi_2SiO_5$ crystal was obtained where the forming time was 5 minutes. However, the thickness thereof was too small to cover the entire substrate, and therefore it is found that the forming time of 10 minutes or more is preferable. As a result, from FIG. 6, the Bi/Ti ratio in the $Bi_2SiO_5$ film is desirably 3 or more.

EXAMPLE 3

Based on the results of Examples 1 and 2, a $Bi_4Ti_3O_{12}$ thin film was formed on a bismuth silicate film having the predominant orientation in the direction of (100) formed at the substrate temperature 500° C. under the forming pressure of 10 Torr for the forming time of 30 minutes. The forming conditions were as follows.

Figure 7A:
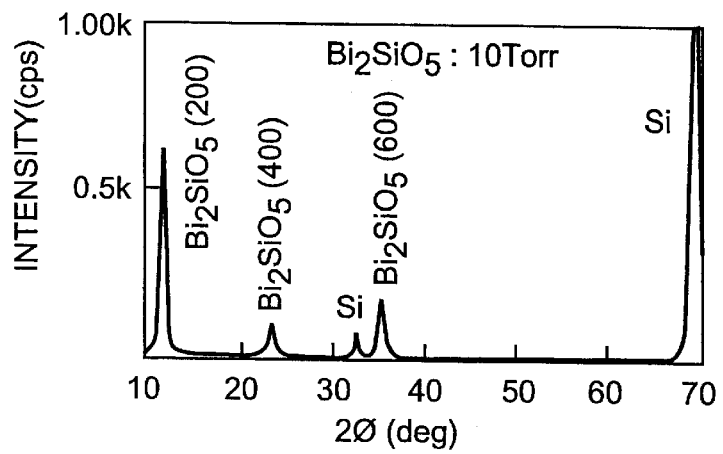
FIGS. 7(a)–7(c) are graphs illustrating X-ray diffraction patterns of a layered film of $Bi_4Ti_3O_{12}/Bi_2SiO_5$ according to Example 3 of the present invention.
Figure 7B:
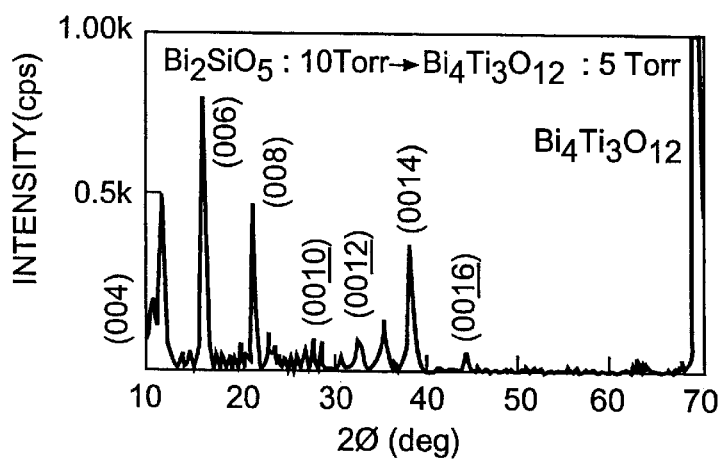
Figure 7C:
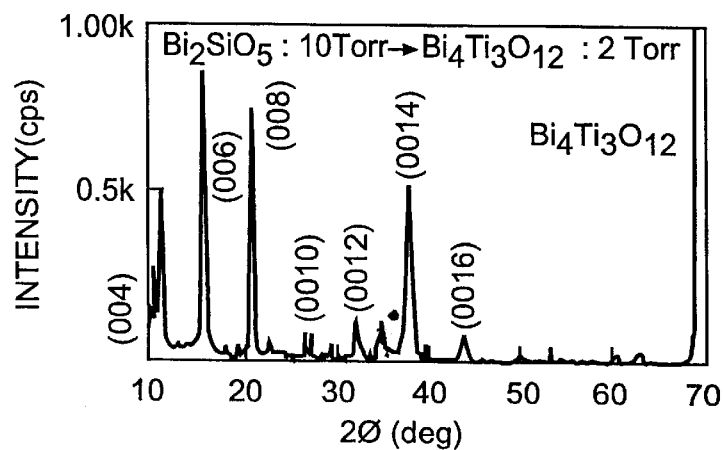

Bi material: Bi(o—$C_7H_7$)$_3$
  Heating temperature of 160° C.,
  Flow rate of carrier gas (Ar) of 300 seem
Ti material: Ti(i—$OC_3H_7$)$_4$
  Heating temperature of 50° C.,
  Flow rate of carrier gas (Ar) of 50 sccm
Oxidizing gas: $O_2$, flow rate of 1000 sccm
Balance gas: Ar, flow rate of 1250 sccm Substrate temperature: five levels of 400, 450, 500, 550 and 600° C.
Forming pressure: two levels of 2 and 5 Torr
Forming time: 60 minutes FIGS. 7(*a*) to 7(*c*) show the XRD pattern of the thin film formed at the substrate temperature of 500° C. The figures show the reflection of the $Bi_4Ti_3O_{12}$ thin film was obtained only the reflections to planes c of (004), (006), (008), (0010), (0012), (0014) and (0016) in addition to the XRD pattern of the bismuth silicate film having the predominant orientation in the direction of (100). This indicates specifically that the $Bi_4Ti_3O_{12}$ thin film oriented along the c-axis was obtained. Further, it is found that the crystallinity thereof was more favorable when formed under 2 Torr. Moreover, it should be noted that the XRD intensity of the bismuth silicate film having the predominant orientation in the direction of (100) did not vary before and after the formation of the $Bi_4Ti_3O_{12}$ thin film. That is, it indicates that the bismuth silicate film effectively influences the control of the orientation of the $Bi_4Ti_3O_{12}$ thin film lying thereon and simultaneously, it does not cause any change (modification) such as mutual diffusion or reaction.

Table 2 shows the evaluation results of the orientation of the $Bi_4Ti_3O_{12}$ thin film obtained from the XRD patterns of the samples formed under the respective conditions.

TABLE 2

| | | substrate temperature (° C.) | | | | |
|---|---|---|---|---|---|---|
| | | 400 | 450 | 500 | 550 | 600 |
| pressure | 2 | pyro | C | C | C | C |
| (Torr) | 5 | pyro | pyro + C | C | C | C |

C: $Bi_4Ti_3O_{12}$ oriented along the c-axis
pyro: pyrochlore phase ($Bi_2Ti_2O_7$)

Figure 8A:
FIGS. 8(a)–8(b) are pictures illustrating surface morphologies of the layered films of $Bi_4Ti_3O_{12}/Bi_2SiO_5$ according to Example 3 of the present invention.
Figure 8B:

Further, FIGS. 8(a) and 8(b) show the surface morphologies for the case where the forming pressure was 2 Torr and the substrate temperatures were 500° C. and 600° C. From the figures, it is found that the roughness of the surface was more increased because the growth of crystalline particles of the $Bi_4Ti_3O_{12}$ thin film was promoted as the substrate temperature became higher.

Accordingly, from Table 2 and FIGS. 8(a) and 8(b), it is understood that the substrate temperature ranging from about 450° C. to 600° C. is preferable in order to obtain the $Bi_4Ti_3O_{12}$ thin film having a smooth surface and oriented along the c-axis.

EXAMPLE 4

In the same manner as the above Example 3, a sample substrate having a structure of $Bi_4Ti_3O_{12}$ thin film (50 nm thick)/bismuth silicate film (20 nm thick)/Si substrate (MFIS structure) covered with a ferroelectric thin film was formed. The forming conditions were the substrate temperature of 500° C., the forming pressure of 10 Torr for forming the bismuth silicate film and of 2 Torr for forming the $Bi_4Ti_3O_{12}$ thin film. On the surface of the $Bi_4Ti_3O_{12}$ thin film an upper electrode Pt having a diameter of 100 μmφ was deposited by evaporation. Further, on a lower surface of the Si substrate a lower electrode Al was entirely deposited by evaporation after an oxide film was removed therefrom. Thus, the sample was fabricated.

Figure 9:
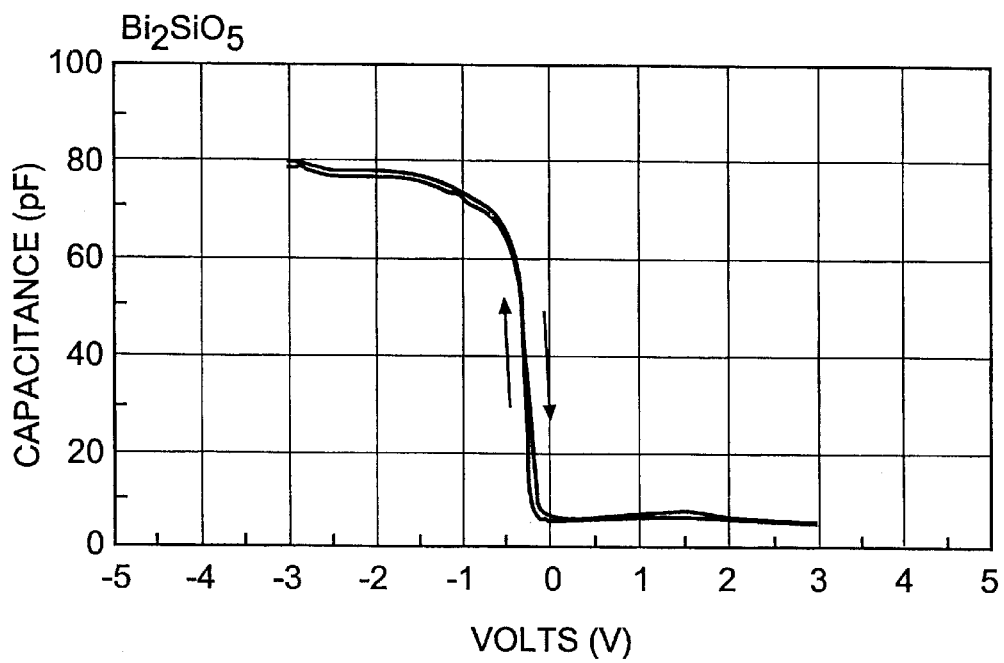
FIG. 9(a) is a graph illustrating the C-V hysteresis characteristics for comparison.
FIG. 9(b) is a graph illustrating the C-V hysteresis characteristics according to Example 4 of the present invention.
Figure 9:
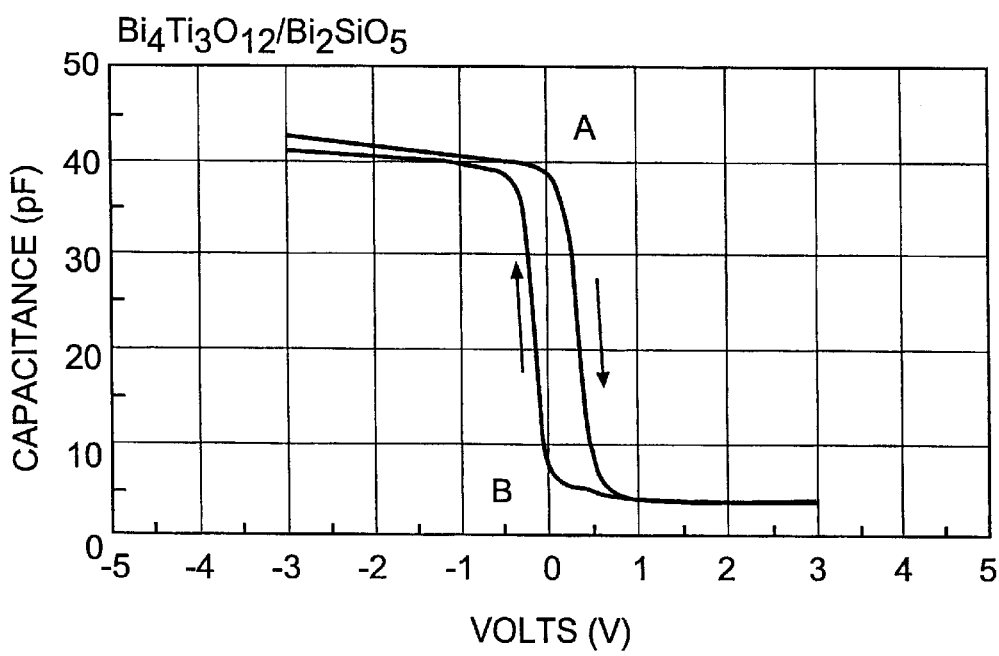

FIGS. 9(a) and 9(b) show the evaluation results of the C-V hysteresis characteristics of the sample. FIG. 9(a) shows the result of the above sample and FIG. 9(b) shows the result of a sample for comparison prepared in the same manner as the above without forming the $Bi_4Ti_3O_{12}$ thin film. From FIG. 9(a), the C-V hysteresis characteristics were not observed for the bismuth silicate film without the $Bi_4Ti_3O_{12}$ thin film, as expected in a MOS structure utilizing a normal dielectric material. On the other hand, from FIG. 9(b), it is found that the C-V hysteresis characteristics clearly reflecting the ferroelectricity can be obtained from the sample layered with the $Bi_4Ti_3O_{12}$ thin film. A window width of the hysteresis at an applied voltage of ±3V was about 0.5 V, which did not vary though a voltage was further applied. Further, in FIG. 9(b), the ferroelectric characteristics were saturated enough at a voltage of 3V. The saturation of the characteristics obtained at such a low voltage is assumed as a result reflecting a low coercive electric field of the $Bi_4Ti_3O_{12}$ thin film oriented along the c-axis and small thicknesses of the $Bi_4Ti_3O_{12}$ thin film and the bismuth silicate film. It is because of the excellent fineness and smoothness of the film surface why thus favorable C-V characteristics are obtained with the $Bi_4Ti_3O_{12}$ thin film having a thickness as small as 50 nm.

Figure 10:
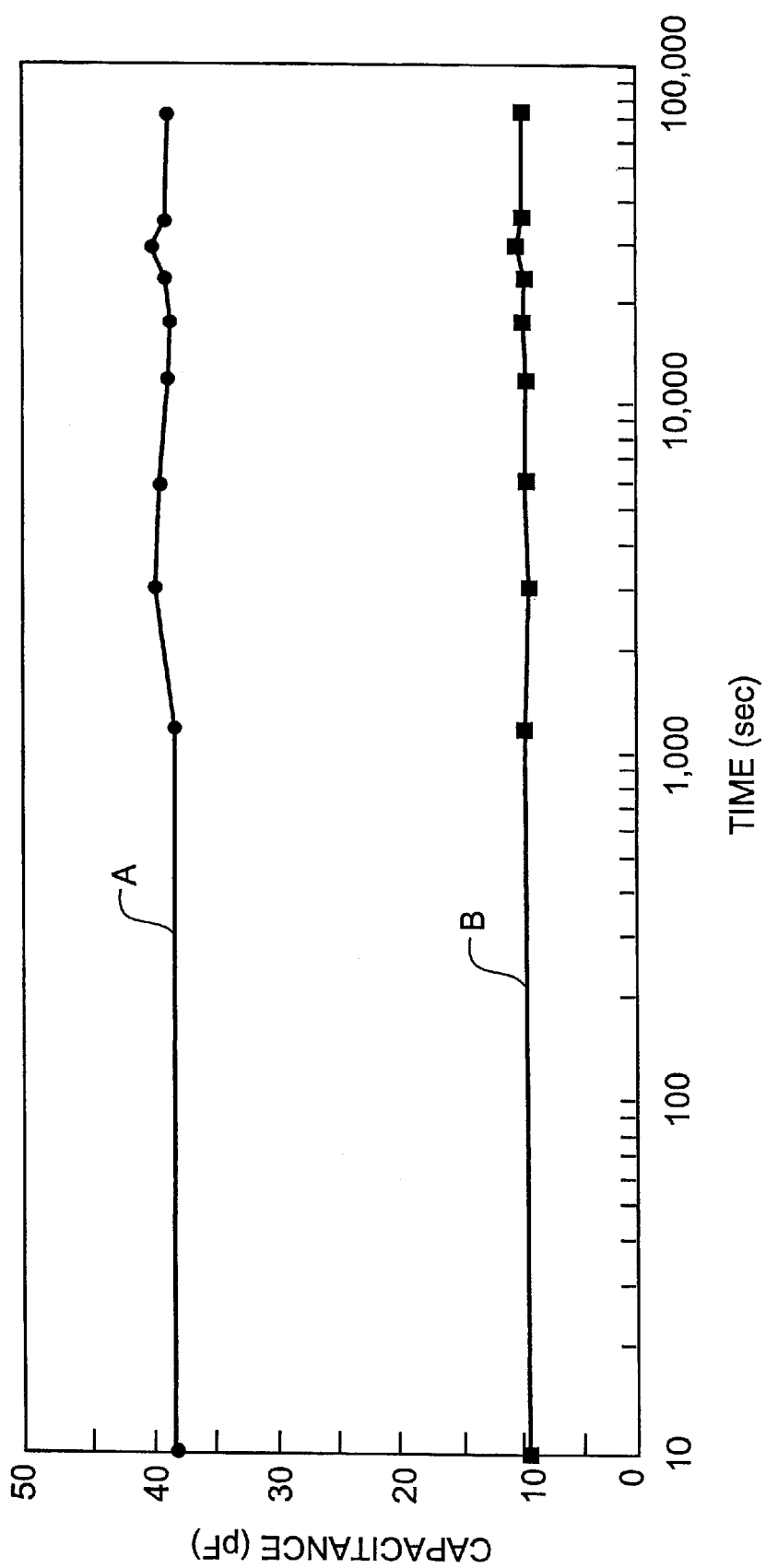
FIG. 10 is a graph illustrating durability of the C-V hysteresis characteristics according to Example 4 of the present invention.

Next, evaluation results of properties for maintaining the C-V hysteresis characteristics are shown in FIG. 10. FIG. 10 indicates a variation in capacitance value (points A and B in FIG. 9(b)) at a bias voltage of 0V with respect to a leaving time after a bias voltage of +3V or −3V is applied to the sample to align the polarization directions thereof and then the voltage is returned to 0 V.

If space charges caused by defects exist in the films constituting the MFIS structure and the interfaces therebetween, it is expected that the space charges move within the ferroelectric thin film owing to an influence of a diamagnetic field, and a state of the spontaneous polarization (i.e., the hysteresis characteristics) is gradually lost. In this case, the memory window width is reduced so that two capacitance values (A and B) at the bias voltage of 0V reflecting the spontaneous polarization state gradually become close to indicate only one value. However, variation in time of the capacitance value of this example shown in FIG. 10 was not observed even after being allowed to stand for 24 hours. Accordingly, the spontaneous polarization state was not varied.

In the document described in the section of Prior Art Jpn. J. Appl. Phys. 34, (1995), 4163–4166, the capacitance value is varied over about 11 hours for $PbTiO_3/CeO_2$-based film. A comparison with this indicates that the properties for maintaining the capacitance value of $Bi_4Ti_3O_{12}/Bi_2SiO_5$-based film of this example is superior. That is, in the structure of $Bi_4Ti_3O_{12}$ thin film/bismuth silicate film/Si substrate of this example, it is assumed that defects at the interfaces of the respective films are less generated than with the conventional materials and methods. Accordingly, it is possible to operate non-volatile memories with high reliability (i.e., with favorable properties for maintaining the capacitance value) by utilizing the MFIS structure as a gate of MOS-FET.

EXAMPLE 5

Determined were the C-V hysteresis characteristics of the MFIS structures formed of the $Bi_4Ti_3O_{12}$ thin films of different thicknesses by utilizing the same forming process as in Example 3. That is, it was examined whether or not the interface conditions of the layered structure of $Bi_4Ti_3O_{12}$ thin film/bismuth bismuth silicate film/Si substrate are deteriorated in the case where a period for forming the $Bi_4Ti_3O_{12}$ thin film is lengthened at a low forming temperature of 500° C. The thickness of the bismuth silicate films was fixed to 50 nm and $Bi_4Ti_3O_{12}$ thin films having thicknesses of 100, 200 and 300 nm were formed thereon, respectively. The C-V hysteresis characteristics of the thus formed MFIS structures are shown in FIG. 11.

Figure 11:
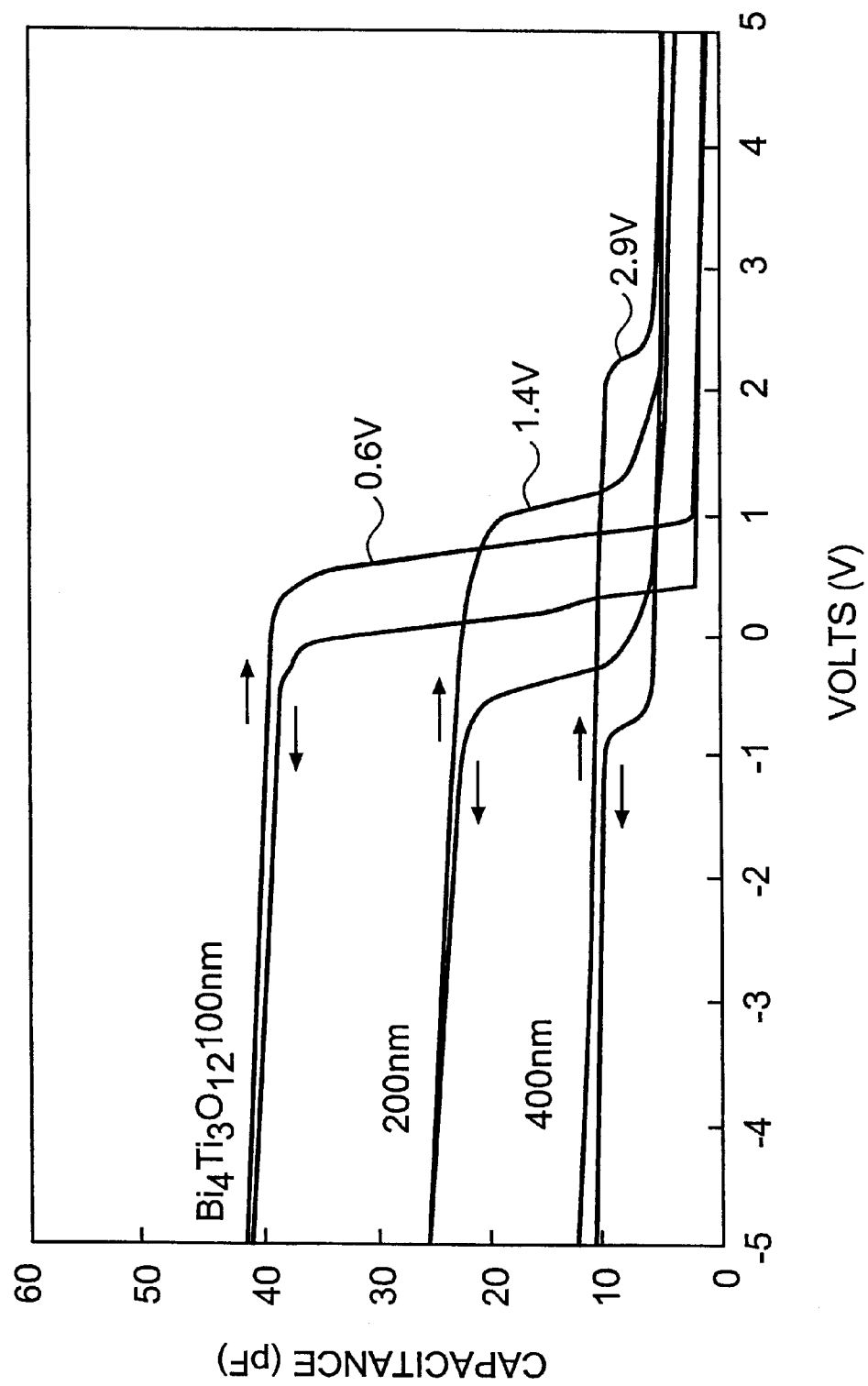
FIG. 11 is a graph illustrating the C-V hysteresis characteristics according to Example 5 of the present invention.

As can be clearly seen in FIG. 11, as the greater the thickness of the $Bi_4Ti_3O_{12}$ thin film was, the smaller the capacitance reduced and the greater the window width became. Here, in a simple layered capacitor model, it is expected that the capacitance is in proportion to an inverse number of the film thickness and the window width of the memory is in proportion to the film thickness. The results of FIG. 11 relatively agree to the model. This indicates that even the forming time was set about 4 times longer (the film thickness is set about 4 times greater), the conditions of the interfaces between the films in the MFIS structure were maintained favorable. Therefore, the MFIS structure utilizing the layered structure of $Bi_4Ti_3O_{12}$ thin film/bismuth silicate film/Si substrate of this example allows lowering the forming temperature, obtaining a fine and smooth film structure and having good reproducibility of the C-V hysteresis characteristics.

EXAMPLE 6

Figure 12:
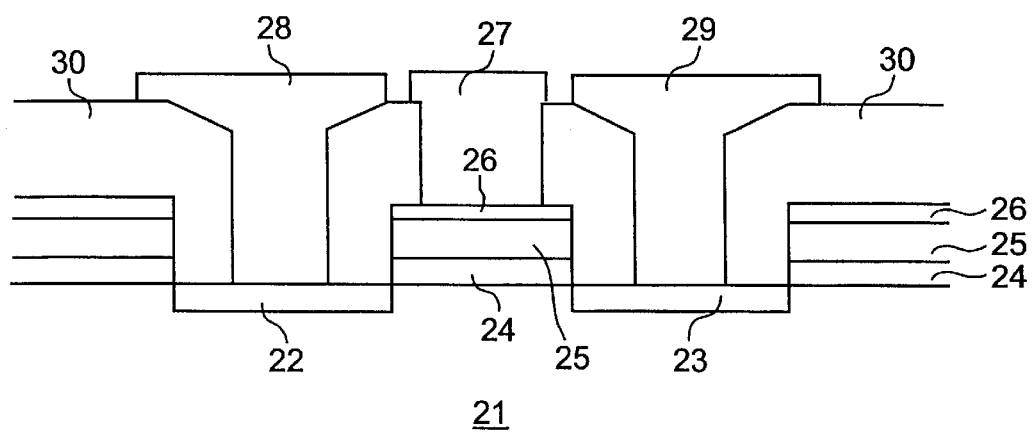
FIG. 12 is a schematic sectional view illustrating a memory device according to Example 6 of the present invention.

A ferroelectric gate FET was formed in which a gate insulating film of MOSFET is replaced with the layered structure of $Bi_4Ti_3O_{12}$ thin film/bismuth silicate film/Si substrate used in Examples 3 and 4. FIG. 12 shows a schematic sectional view illustrating thereof. The ferroelectric gate FET shown in FIG. 12 is a fundamental device of 1-transistor type non-volatile memories. In other words, the magnitude of electric current flowing between a source and a drain varies in accordance with the existence or inexistence of a depletion layer in a channel region between the source and the drain dependent on the polarization direction of the ferroelectric thin film. Accordingly, by detecting the current, the polarization state of the ferroelectric thin film, i.e., binary information of 1 or 0 can be read out.

Hereinafter, a process for forming the ferroelectric gate FET of FIG. 12 and operation thereof will be explained.

First, on a Si substrate 21, a bismuth silicate film 24, a $B_4Ti_3O_{12}$ thin film 25 and a gate electrode layer (an upper electrode) 26 were formed in the same manner as in Examples 3 and 4. Then, the bismuth silicate film 24, the $Bi_4Ti_3O_{12}$ thin film 25 and the gate electrode layer 26 in a region for forming a source 22 and a drain 23 were removed by etching. Next, the source 22 and the drain 23 were formed by ion implantation. Further, the entire device was covered with a PSG interlayer insulating film 30. Thereafter, the PSG interlayer insulating film 30 on the source 22, the drain 23 and the gate electrode layer 26 was removed to form contact holes. Then, wires made of metal (27, 28 and 29) were formed at the contact holes to form a ferroelectric gate FET.

The above ferroelectric gate FET is operated in the following manner.

First, a positive or negative pulse voltage was applied to the gate electrode layer 26 for control and the direction of spontaneous polarization of the $Bi_4Ti_3O_{12}$ thin film 25 is fixed so as to write information. In accordance with the spontaneous polarization direction of the $Bi_4Ti_3O_{12}$ thin film 25, two states occur, one of which generates a depletion layer on a semiconductor surface immediately under the gate and the other of which does not generate it. This is caused by the C-V hysteresis characteristics explained in the above examples. Therefore, the current flowing between the source 22 and the drain 23 can be ON—OFF switched by the spontaneous polarization direction of the $Bi_4Ti_3O_{12}$ thin film 25. The spontaneous polarization direction (i.e., information) can be read out by detecting the current between the source and the drain. Thus, the polarization state of the $Bi_4Ti_3O_{12}$ thin film 25 is maintained at the reading of the information, therefore the written information is not destroyed by the reading operation. Further, this example employs the ferroelectric gate FET comprising the layered structure of $Bi_4Ti_3O_{12}$ thin film/bismuth silicate film/Si substrate, so that a period for maintaining information (memory) can be lengthened.

EFFECT OF THE INVENTION

According to the present invention, forming a ferroelectric thin film having high quality on a Si substrate, which has been a subject in applying a ferroelectric thin film of oxide of Bi-based layered structure to non-volatile memories of 1-transistor type and an infrared sensor array, can be realized with good reproducibility. That is, by using a fabrication process of the present invention, superior ferroelectricity of the ferroelectric thin film of Bi-containing oxide of layered structure in the direction of c-axis can be effectively expressed. Further, since the ferroelectric thin film can be formed at a low temperature, reaction and mutual diffusion with the Si substrate can be prevented. Moreover, since a fine ferroelectric thin film having a smooth surface can be obtained, good ferroelectricity can be obtained even if the thickness is small. Accordingly, a device of a MFIS structure utilizing the ferroelectric thin film can reverse the polarization at a low voltage, so that an operation voltage can be lowered and a period for maintaining memory can be lengthened.

Further, a fine insulating film having a smooth surface and a predominant orientation in the direction of (100) which is suitable for the MFIS structure can be formed with good reproducibility. An insulating film having greater fineness and a smoother surface can be obtained by forming the insulating film by a MOCVD technique and supplying a Bi material together with a Ti material onto the Si substrate.

Still further, a ferroelectric thin film oriented along the c-axis (e.g., a $Bi_4Ti_3O_{12}$ thin film) can be formed with good reproducibility on the insulating film having the predominant orientation in the direction of (100).

Furthermore, at the formation of the $Bi_4Ti_3O_{12}$ thin film oriented along the c-axis on the insulating film having the predominant orientation in the direction of (100), the same forming device for the MOCVD technique can be used and parameters such as conditions for supplying materials and a temperature of the Si substrate (except for a forming pressure) can be fixed. Accordingly, necessity of re-adjusting a plurality of parameters during the formation in accordance with the change in the forming conditions is eliminated, which allows the formation much easier and convenient.

Moreover, since the fine insulating film having a smooth surface can be formed, the thickness of the insulating film itself can be reduced. Therefore, a greater voltage can be distributed to the ferroelectric thin film formed on the insulating film. Further, since the $Bi_4Ti_3O_{12}$ thin film formed on the insulating film also has a fine a smooth surface, current leakage caused by the pinholes does not occur even if the thickness of the $Bi_4Ti_3O_{12}$ thin film itself is reduced. Therefore, the ferroelectric thin film can be formed thin, and if a ferroelectric thin film oriented along the c-axis having a smaller coercive electric field is used, a voltage necessary to apply to reverse the polarization can be reduced.

Further, the MFIS structure utilizing the above insulating film and the ferroelectric thin film can be applied to a gate of FET or the like. In particular, as described in examples, since lattice mismatch among the films constituting the MFIS structure is small and reaction and mutual diffusion at interfaces between the films can be inhibited because of a low forming temperature, generation of defects and moving charges which shorten the period for maintaining memory can be prevented. Accordingly, as compared with a conventional thin film device, the period for maintaining the memory can be lengthened.

What is claimed is:

1. An insulating material comprising a crystalline material containing Ti in $Bi_2SiO_5$ in an atomic concentration ratio Bi/Ti of 3 or more.

2. A substrate covered with an insulating film wherein an insulating material including a crystalline material containing Ti in $Bi_2SiO_5$ in an atomic concentration ratio Bi/Ti of 3 or more is formed on a Si substrate as an insulating film.

3. A substrate covered with an insulating film according to claim 2, wherein the insulating film has a predominant orientation in the direction of (100).

4. A substrate covered with an insulating film according to claim 2, further comprising a ferroelectric thin film of a Bi-containing oxide of layered structure formed on the insulating film.

5. A substrate covered with an insulating film according to claim 4, wherein the ferroclectric thin film is comprised of $Bi_4Ti_3O_{12}$ oriented along c-axis.

6. A substrate covered with an insulating film according to claim 5, wherein the ferroelectric thin film is thicker than the insulating film.

7. A substrate covered with an insulating film according to claim 6, wherein the insulating film has a thickness of 20 nm or less.

8. A thin film device comprising electrodes on an upper surface of a ferroelectric thin film formed on a substrate covered with an insulating film wherein the insulating film includes a crystalline material containing Ti in $Bi_2SiO_5$ in an atomic concentration ratio Bi/Ti of 3 or more, and on a lower surface of a Si substrate, and comprising a structure of the upper electrode/the ferroelectric thin film/the insulating film/the Si substrate/the lower electrode.

9. A thin film device according to claim 8, wherein the structure of upper electrode/ferroelectric thin film/insulating film in the structure of the thin film device serves as a gate element of a MOS-FET.

10. A thin film device according to claim 9, wherein the thin film device is a memory cell of a ferroelectric memory device.

* * * * *